(12) United States Patent
Parthasarathy et al.

(10) Patent No.: US 10,572,338 B2
(45) Date of Patent: Feb. 25, 2020

(54) ESTIMATING AN ERROR RATE ASSOCIATED WITH MEMORY

(71) Applicant: Micron Technology, Inc., Boise, ID (US)

(72) Inventors: Sivagnanam Parthasarathy, Carlsbad, CA (US); Mustafa N. Kaynak, San Diego, CA (US); Patrick R. Khayat, San Diego, CA (US); Nicholas J. Richardson, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/055,384

(22) Filed: Aug. 6, 2018

(65) Prior Publication Data

US 2018/0341546 A1 Nov. 29, 2018

Related U.S. Application Data

(62) Division of application No. 15/381,432, filed on Dec. 16, 2016, now Pat. No. 10,061,643, which is a (Continued)

(51) Int. Cl.
| | |
|---|---|
| *G06F 11/10* | (2006.01) |
| *G11C 11/56* | (2006.01) |
| *G11C 29/52* | (2006.01) |
| *H03M 13/11* | (2006.01) |
| *G06F 11/07* | (2006.01) |
| *H03M 13/37* | (2006.01) |
| *H03M 13/00* | (2006.01) |
| *G11C 29/56* | (2006.01) |
| *G06F 11/08* | (2006.01) |

(Continued)

(52) U.S. Cl.
CPC ......... *G06F 11/1048* (2013.01); *G06F 11/07* (2013.01); *G06F 11/073* (2013.01); *G06F 11/076* (2013.01); *G06F 11/0793* (2013.01); *G06F 11/08* (2013.01); *G06F 11/1068* (2013.01); *G11C 11/5628* (2013.01); *G11C 11/5642* (2013.01); *G11C 29/00* (2013.01); *G11C 29/52* (2013.01); *G11C 29/56008* (2013.01); *H03M 13/1102* (2013.01); *H03M 13/3715* (2013.01); *H03M 13/3738* (2013.01); *H03M 13/612* (2013.01); *G11C 2029/0411* (2013.01)

(58) Field of Classification Search
CPC ............. G06F 11/1048; G11C 11/5642; G11C 11/5628; G11C 29/52
See application file for complete search history.

(56) References Cited

U.S. PATENT DOCUMENTS

| | | |
|---|---|---|
| 5,109,304 A | 4/1992 | Pederson |
| 5,233,487 A | 8/1993 | Christensen et al. |

(Continued)

*Primary Examiner* — Joseph D Torres
(74) *Attorney, Agent, or Firm* — Brooks, Cameron & Huebsch, PLLC

(57) ABSTRACT

The present disclosure includes apparatuses and methods for estimating an error rate associated with memory. A number of embodiments include sensing data stored in a memory, performing an error detection operation on the sensed data, determining a quantity of parity violations associated with the error detection operation, and estimating an error rate associated with the memory based on the determined quantity of parity violations.

20 Claims, 6 Drawing Sheets

Related U.S. Application Data division of application No. 14/607,206, filed on Jan. 28, 2015, now Pat. No. 9,558,064.

(51) Int. Cl.
*G11C 29/00* (2006.01)
*G11C 29/04* (2006.01)

(56) References Cited

U.S. PATENT DOCUMENTS

| | | | |
|---|---|---|---|
| 5,530,705 A | 6/1996 | Malone, Sr. | |
| 6,442,711 B1 | 8/2002 | Sasamoto et al. | |
| 6,560,272 B1 | 5/2003 | Komatsu | |
| 8,161,334 B1 | 4/2012 | Hulbert et al. | |
| 8,412,985 B1 | 4/2013 | Bowers et al. | |
| 8,689,092 B2 * | 4/2014 | Sun | H03M 13/033 714/800 |
| 8,788,910 B1 | 7/2014 | Northcott | |
| 8,935,465 B1 | 1/2015 | Shaharabany et al. | |
| 8,982,617 B1 * | 3/2015 | Mekhanik | G11C 16/3418 365/185.02 |
| 8,988,946 B1 * | 3/2015 | D'Abreu | G11C 16/28 365/185.21 |
| 8,996,838 B1 | 3/2015 | D'Abreu et al. | |
| 9,036,428 B1 | 5/2015 | D'Abreu | |
| 9,042,160 B1 | 5/2015 | Gorobets et al. | |
| 9,064,569 B1 | 6/2015 | Gorobets et al. | |
| 9,159,426 B1 | 10/2015 | D'Abreue | |
| 9,209,897 B2 | 12/2015 | Amitai et al. | |
| 9,318,166 B2 | 4/2016 | Sharon et al. | |
| 2004/0161052 A1 | 8/2004 | Santhoff et al. | |
| 2005/0281112 A1 | 12/2005 | Ito et al. | |
| 2007/0033352 A1 | 2/2007 | Ferren et al. | |
| 2007/0058450 A1 | 3/2007 | Ferren et al. | |
| 2007/0058505 A1 | 3/2007 | Ferren et al. | |
| 2007/0061370 A1 | 3/2007 | Ferren et al. | |
| 2007/0253316 A1 | 11/2007 | Ferren et al. | |
| 2010/0046352 A1 | 2/2010 | Ferren et al. | |
| 2010/0058004 A1 | 3/2010 | Ferren et al. | |
| 2010/0106901 A1 | 4/2010 | Higeta et al. | |
| 2010/0332894 A1 | 12/2010 | Bowers et al. | |
| 2010/0332895 A1 | 12/2010 | Billing et al. | |
| 2010/0332943 A1 | 12/2010 | D'Abreu et al. | |
| 2010/0332950 A1 | 12/2010 | Billing et al. | |
| 2011/0019509 A1 | 1/2011 | Ferren et al. | |
| 2011/0280069 A1 | 11/2011 | Patapoutian et al. | |
| 2012/0226963 A1 | 9/2012 | Bivens et al. | |
| 2013/0024605 A1 | 1/2013 | Sharon et al. | |
| 2013/0028021 A1 | 1/2013 | Sharon et al. | |
| 2013/0031430 A1 | 1/2013 | Sharon | |
| 2013/0031431 A1 | 1/2013 | Sharon et al. | |
| 2013/0031443 A1 | 1/2013 | Oh et al. | |
| 2013/0055046 A1 | 2/2013 | Blodgett et al. | |
| 2013/0094289 A1 | 4/2013 | Sridharan et al. | |
| 2013/0227199 A1 | 8/2013 | Liu et al. | |
| 2014/0157086 A1 * | 6/2014 | Sharon | G06F 11/1012 714/773 |
| 2014/0281772 A1 | 9/2014 | Jeon et al. | |
| 2014/0334228 A1 * | 11/2014 | Kim | G06F 11/1072 365/185.03 |
| 2014/0355340 A1 * | 12/2014 | Sharon | G11C 16/26 365/185.03 |
| 2015/0085573 A1 * | 3/2015 | Sharon | G06F 11/1048 365/185.03 |
| 2015/0085575 A1 | 3/2015 | Tam | |
| 2015/0103593 A1 | 4/2015 | Su | |
| 2015/0135023 A1 * | 5/2015 | Mekhanik | G11C 16/3427 714/704 |
| 2015/0135039 A1 * | 5/2015 | Mekhanik | G06F 11/1072 714/773 |
| 2015/0179284 A1 * | 6/2015 | Alrod | G06F 11/076 714/704 |
| 2015/0234706 A1 * | 8/2015 | Alrod | G06F 11/1072 714/704 |
| 2015/0301887 A1 | 10/2015 | Zhang et al. | |
| 2015/0301985 A1 | 10/2015 | Zhang et al. | |
| 2015/0339187 A1 | 11/2015 | Sharon et al. | |
| 2015/0363262 A1 * | 12/2015 | Hu | G06F 11/1048 714/773 |
| 2016/0011790 A1 | 1/2016 | Rostoker et al. | |
| 2016/0011964 A1 | 1/2016 | Rostoker et al. | |
| 2016/0049203 A1 | 2/2016 | Alrod et al. | |
| 2016/0103630 A1 | 4/2016 | Shen | |
| 2016/0141029 A1 | 5/2016 | Navon et al. | |
| 2016/0162185 A1 * | 6/2016 | D'Abreu | G06F 11/076 711/103 |
| 2016/0162215 A1 | 6/2016 | Jayaraman et al. | |
| 2016/0162353 A1 | 6/2016 | Manohar et al. | |
| 2016/0170682 A1 * | 6/2016 | Bakshi | G06F 3/0649 711/103 |

* cited by examiner

ESTIMATING AN ERROR RATE ASSOCIATED WITH MEMORY

PRIORITY INFORMATION

This application is a Divisional of U.S. application Ser. No. 15/381,432 filed Dec. 16, 2016, which is a Divisional of U.S. application Ser. No. 14/607,206 filed Jan. 28, 2015, now U.S. Pat. No. 9,558,064, the specifications of which are incorporated herein by reference.

TECHNICAL FIELD

The present disclosure relates generally to semiconductor memory and methods, and more particularly, to estimating an error rate associated with memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

A state of a flash memory cell can be determined by sensing the stored charge on the charge storage structure (e.g., the Vt) of the cell. However, a number of mechanisms, such as read disturb, program disturb, cell-to-cell interference, and/or charge loss (e.g., charge leakage), for example, can cause the Vt of the memory cell to change. As a result of the change in the Vt, an error may occur when the state of the cell is sensed. For example, the cell may be sensed to be in a state other than the target state (e.g., a state different than the state to which the cell was programmed). Such errors may or may not be correctable by error correction code (ECC) schemes such as, for example, a low-density parity-check (LDPC) ECC scheme.

DETAILED DESCRIPTION

Figure 1:
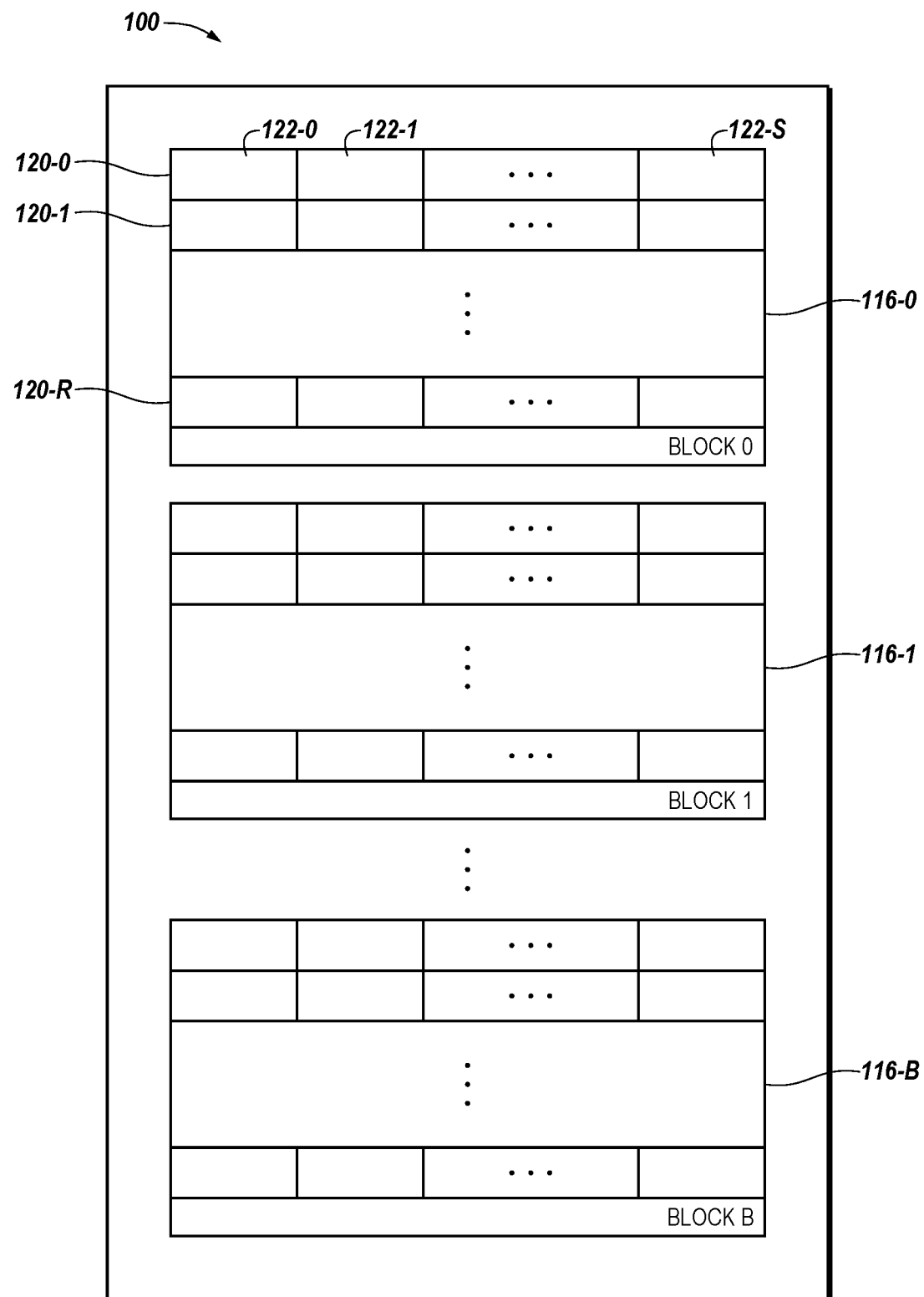
FIG. 1 illustrates a diagram of a portion of a memory array having a number of physical blocks in accordance with a number of embodiments of the present disclosure.

The present disclosure includes apparatuses and methods for estimating an error rate associated with memory (e.g., with a page of the memory). A number of embodiments include sensing data stored in a memory, performing an error detection operation on the sensed data, determining a quantity of parity violations associated with the error detection operation, and estimating an error rate associated with the memory based on the determined quantity of parity violations.

An error rate associated with memory estimated in accordance with the present disclosure (e.g., using the quantity of parity violations associated with an error correction code such as an LDPC code) can be used, for example, (i) in mitigating lower page misplacement (e.g., write-in-errors) that may occur while programming the memory, (ii) as an indication of whether soft data associated with the memory should be generated anticipating that the ECC may be unable to correct bit errors using only hard data information, (iii) avoiding error correction while compacting data stored in multiple SLC pages of the memory to a single MLC page of the memory if the number of bit errors are low enough, and/or (iv) for calibrating sensing voltages (e.g., read voltage thresholds) used to sense the state of the memory, which can increase the performance (e.g., increase the speed, increase the reliability, and/or decrease the power consumption) of the memory, among other benefits. Further, embodiments of the present disclosure can estimate the error rate on the memory die (e.g., rather than using a controller), which can reduce the complexity and/or further increase the performance of the memory, among other benefits.

As used herein, "a number of" something can refer to one or more such things. For example, a number of memory cells can refer to one or more memory cells. Additionally, the designators "N", "B", "R", and "S", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 200 in FIG. 2.

FIG. 1 illustrates a diagram of a portion of a memory array 100 having a number of physical blocks in accordance with a number of embodiments of the present disclosure. Memory array 100 can be, for example, a NAND flash memory array. However, embodiments of the present disclosure are not limited to a particular type of memory or memory array. For example, memory array 100 can be a DRAM array, an RRAM array, or a PCRAM array, among other types of memory arrays. Further, although not shown in FIG. 1, memory array 100 can be located on a particular semiconductor die along with various peripheral circuitry associated with the operation thereof, as will be further described herein.

As shown in FIG. 1, memory array 100 has a number of physical blocks 116-0 (BLOCK 0), 116-1 (BLOCK 1), . . . , 116-B (BLOCK B) of memory cells. The memory cells can be single level cells and/or multilevel cells such as, for instance, triple level cells (TLCs). As an example, the number of physical blocks in memory array 100 may be 128 blocks, 512 blocks, or 1,024 blocks, but embodiments are not limited to a particular multiple of 128 or to any particular number of physical blocks in memory array 100.

A number of physical blocks of memory cells (e.g., blocks 116-0, 116-1, . . . , 116-B) can be included in a plane of memory cells, and a number of planes of memory cells can be included on a die. For instance, in the example shown in FIG. 1, each physical block 116-0, 116-1, . . . , 116-B can be part of a single die. That is, the portion of memory array 100 illustrated in FIG. 1 can be die of memory cells.

As shown in FIG. 1, each physical block 116-0, 116-1, . . . , 116-B contains a number of physical rows (e.g., 120-0, 120-1, . . . , 120-R) of memory cells coupled to access lines (e.g., word lines). The number of rows (e.g., word lines) in each physical block can be 32, but embodiments are not limited to a particular number of rows 120-0, 120-1, . . . , 120-R per physical block. Further, although not shown in FIG. 1, the memory cells can be coupled to sense lines (e.g., data lines and/or digit lines).

As one of ordinary skill in the art will appreciate, each row 120-0, 120-1, . . . , 120-R can include a number of pages of memory cells (e.g., physical pages). A physical page refers to a unit of programming and/or sensing (e.g., a number of memory cells that are programmed and/or sensed together as a functional group). In the embodiment shown in FIG. 1, each row 120-0, 120-1, . . . , 120-R comprises one physical page of memory cells. However, embodiments of the present disclosure are not so limited. For instance, in a number of embodiments, each row can comprise multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple pages (e.g., logical pages) of data (e.g., an upper page of data and a lower page of data, with each cell in a physical page storing one or more bits towards an upper page of data and one or more bits towards a lower page of data).

A program operation (e.g., a write operation) can include applying a number of program pulses (e.g., 16V-20V) to a selected word line in order to increase the threshold voltage (Vt) of the selected cells coupled to that selected word line to a desired program voltage level corresponding to a target (e.g., desired) data state. A sense operation, such as a read or program verify operation, can include sensing a voltage and/or current change of a sense line coupled to a selected cell in order to determine the data state of the selected cell.

In a number of embodiments of the present disclosure, and as shown in FIG. 1, a page of memory cells can comprise a number of physical sectors 122-0, 122-1, . . . , 122-S (e.g., subsets of memory cells). Each physical sector 122-0, 122-1, . . . , 122-S of cells can store a number of logical sectors of data (e.g., data words). Additionally, each logical sector of data can correspond to a portion of a particular page of data. As an example, a first logical sector of data stored in a particular physical sector can correspond to a logical sector corresponding to a first page of data, and a second logical sector of data stored in the particular physical sector can correspond to a second page of data. Each physical sector 122-0, 122-1, . . . , 122-S, can store system and/or user data, and/or can include overhead data, such as error correction code (ECC) data, logical block address (LBA) data, and recurring error data.

Logical block addressing is a scheme that can be used by a host for identifying a logical sector of data. For example, each logical sector can correspond to a unique logical block address (LBA). Additionally, an LBA may also correspond to a physical address. A logical sector of data can be a number of bytes of data (e.g., 256 bytes, 512 bytes, or 1,024 bytes). However, embodiments are not limited to these examples.

It is noted that other configurations for the physical blocks 116-0, 116-1, . . . , 116-B, rows 120-0, 120-1, . . . , 120-R, sectors 122-0, 122-1, . . . , 122-S, and pages are possible. For example, rows 120-0, 120-1, . . . , 120-R of physical blocks 116-0, 116-1, . . . , 116-B can each store data corresponding to a single logical sector which can include, for example, more or less than 512 bytes of data.

Figure 2:
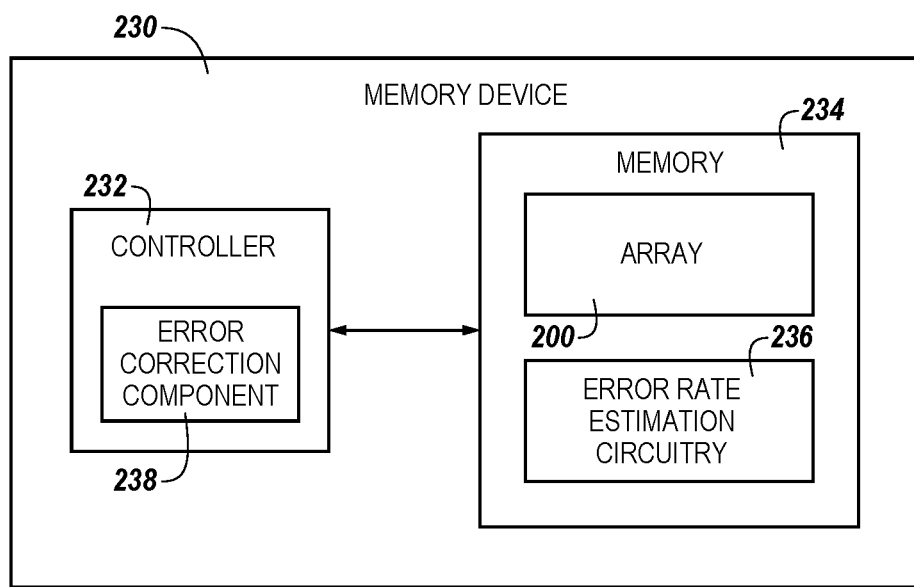
FIG. 2 illustrates a block diagram of an apparatus in the form of a memory device in accordance with a number of embodiments of the present disclosure.

FIG. 2 illustrates a block diagram of an apparatus in the form of a memory device 230 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

Memory device 230 can be coupled (e.g., connected) to, and communicate information with, a host (not shown in FIG. 2 for clarity and so as not to obscure embodiments of the present disclosure). The host can include a memory access device (e.g., a processor). One of ordinary skill in the art will appreciate that "a processor" can intend a number of processors, such as a parallel processing system, a number of coprocessors, etc. Example hosts can include personal laptop computers, desktop computers, digital cameras, digital recording and playback devices, mobile (e.g., smart) phones, PDAs, memory card readers, interface hubs, and the like.

As shown in FIG. 2, memory device 230 includes a controller 232 coupled to a memory 234. Controller 232 can include, for example, control circuitry and/or logic (e.g., hardware and firmware). For instance, controller 232 can include error correction component 238, as illustrated in FIG. 2. Error correction component 238 can correct errors that may occur when the data state of the memory cells of memory 234 (e.g., array 200) are sensed. For example, error correction component 238 can be a low-density parity-check (LDPC) ECC component that can utilize an LDPC ECC scheme to correct the errors.

Controller 232 can be included on the same physical device (e.g., the same die) as memory array 234, or can be included on a separate physical device that is communicatively coupled to the physical device that includes memory 234. In a number of embodiments, components of controller 232 can be spread across multiple physical devices (e.g., some components on the same die as the memory, and some components on a different die, module, or board) as a distributed controller.

As shown in FIG. 2, memory 234 can include a memory array 200. Memory array 200 can be, for example, memory array 100 previously described in connection with FIG. 1. Although one memory array is shown in FIG. 2, embodiments of the present disclosure are not so limited (e.g., memory device 230 can include more than one memory array coupled to controller 232).

In the example illustrated in FIG. 2, memory 234 includes error rate estimation circuitry 236. That is, error rate estimation circuitry 236 can be included on the same physical device (e.g., the same die) as memory 234 (e.g., circuitry 236 can be included on the same die as array 200). Including error rate estimation circuitry 236 in memory 234 can reduce the complexity and/or increase the performance (e.g., increase the speed, increase the reliability, and/or decrease the power consumption) of memory device 230. However, embodiments of the present disclosure are not so limited. For example, in a number of embodiments, error rate estimation circuitry 236 may be included in controller 232 instead of memory 234.

Figure 6:
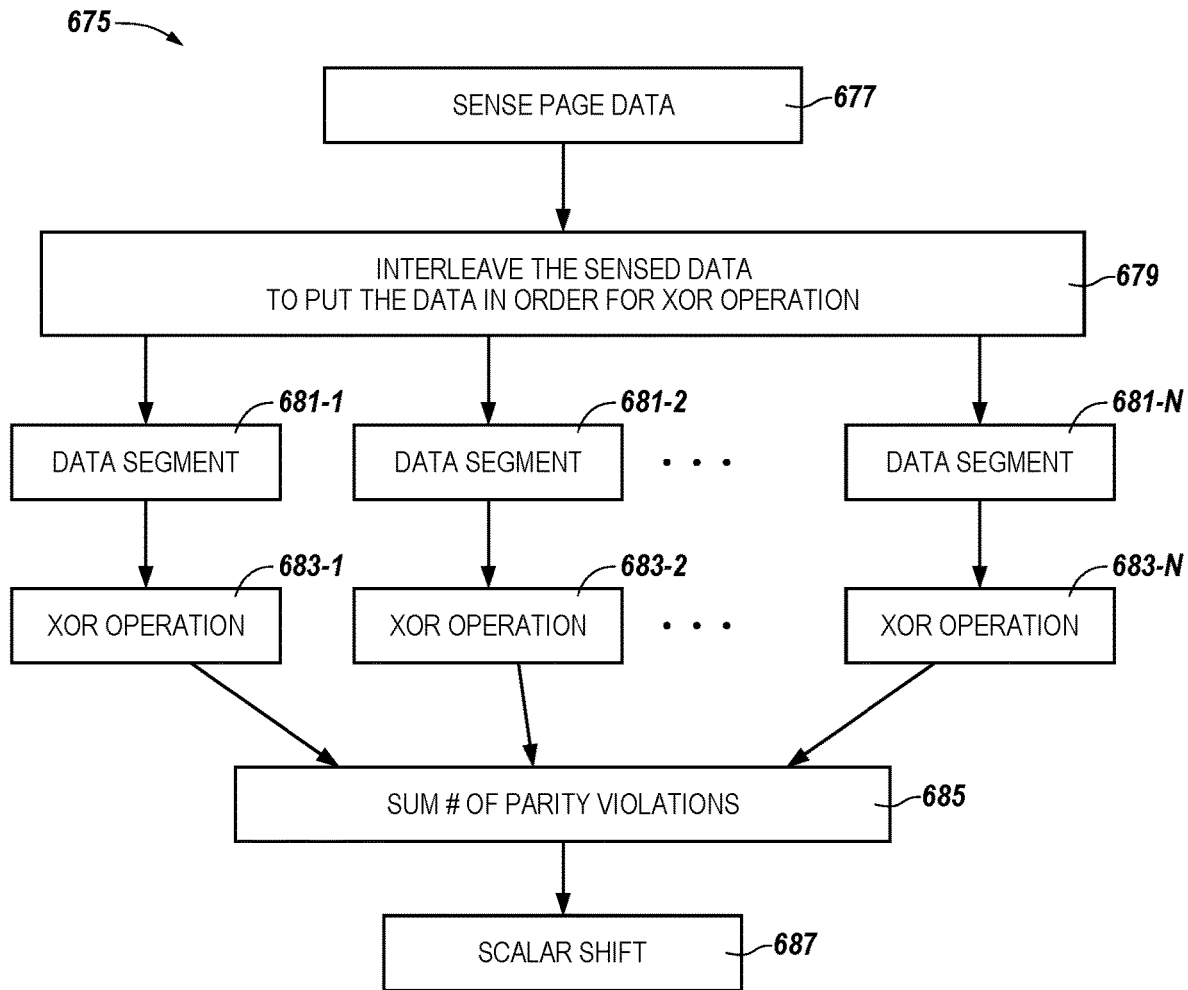
FIG. 6 illustrates a method for estimating an error rate associated with memory in accordance with a number of embodiments of the present disclosure.

Error rate estimation circuitry 236 can be used to estimate an error rate associated with memory 234. For instance, circuitry 236 can be used to estimate an error rate associated with the memory cells (e.g., an error rate associated with the data stored in a page of the memory cells) of memory array 200. FIG. 6 illustrates an example of a method 675 that can be used by error rate estimation circuitry 236 to estimate the error rate.

For example, as shown at block 677 of FIG. 6, controller 232 can initiate a sense operation to sense the data stored in array 200. For instance, the sense operation can sense a page of data (e.g., a logical page) stored in a group (e.g., a physical page) of memory cells in array 200. The sensed data may be stored in memory 234 (e.g., in a different portion of array 200).

Error rate estimation circuitry 236 can perform an error detection operation on the sensed data. For example, error rate estimation circuitry 236 can perform a parity check operation on part of the low-density parity-check (LDPC) code's parities to estimate the error rate on the sensed data. That is, the count of LDPC code parity violations can be used for the error estimation operation. However, embodiments of the present disclosure are not limited to a particular type of error detection operation.

The LDPC operation may be an operation that is part of an LDPC ECC scheme. As an example, the LDPC operation may use a code constraint that includes a number of parity check equations. The sensed page may have an integer number of LDPC codewords associated therewith, and the LDPC operation may use one of the parity check equations to check each codeword bit against one parity check equation. However, the contiguous bits that form a codeword may not be stored in contiguous locations in the page. As such, the bits that form a parity equation (e.g., a segment), may be interleaved on the array. Accordingly, as shown at block 679 of FIG. 6, the LDPC operation may include interleaving the sensed data of the page into a number of data segments 681-1, 681-2, . . . , 681-N illustrated in FIG. 6, with each segment including the same amount of data (e.g., bits), to put the data in order for an XOR operation. As shown at blocks 683-1, 683-2, . . . , 683-N of FIG. 6, the XOR operation can then be performed on each of the data segments. Each data segment can correspond to one of the parity check equations of the LDPC code, and each LDPC codeword bit may be checked only once against a parity check of the LDPC code in order to facilitate the error estimation.

Error rate estimation circuitry 236 can determine (e.g., count) the quantity (e.g., number) of parity violations associated with the error detection operation (e.g., LDPC operation). The determined quantity can represent, for example, a lower bound of the number of times an error occurs on the LDPC codeword. For instance, as shown at block 685 of FIG. 6, circuitry 236 can determine the quantity of parity violations associated with the operation by summing the quantity of parity violations that occur during the XOR operations performed on the data segments (e.g., the number of times an error occurs when an XOR'd data segment is checked by one of the parity equations).

Error rate estimation circuitry 236 can then estimate the error rate associated with the memory (e.g., the error rate associated with the page) based on the determined quantity of parity violations. As used herein, an "error rate" can be, for example, a bit error rate (BER), and can refer to an amount of erroneous bits corresponding to an amount of erroneous data sensed from a memory during a sense operation divided by the total amount of data sensed during the sense operation (e.g., the sample size). For example, circuitry 236 can estimate the error rate by dividing the determined quantity of parity violations by the amount of data on which the error detection operation was performed (e.g., the sample size), and then multiply the division result by a scalar that is greater than one (e.g., perform a scalar shift on the division result), as illustrated at block 687 of FIG. 6. As an example, if eight 1 KB LDPC codewords were used in an LDPC operation, the sample size would be 8 KB. However, embodiments of the present disclosure are not limited to a particular type or size of codeword.

Using the scalar in the error rate estimation can increase the accuracy of the estimation. For example, the scalar can account for the fact that the exact number of bit errors (e.g., whether there is an even number of bit errors or an odd number of bit errors) per parity violation is unknown. In a number of embodiments, the scalar can be based on (e.g., be a function of) the determined quantity of parity violations. For instance, the scalar can be a dynamic scalar that is directly proportional to (e.g., increases with) the quantity of parity violations and can be determined after the quantity of parity violations has been determined. However, embodiments of the present disclosure are not so limited. For example, in a number of embodiments, the scalar can be a fixed (e.g., pre-determined) value that does not depend on the quantity of parity violations.

The estimated error rate can be used, for example, (i) in mitigating lower page misplacement that may occur while programming the memory, (ii) as an indication of whether soft data associated with the memory should be generated, and/or (iii) avoiding error correction while compacting data stored in multiple SLC pages of the memory to a single MLC page of the memory, as will be further described herein (e.g., in connection with FIGS. 3, 4, and 5, respectively), which can increase the performance (e.g., increase the speed, increase the reliability, and/or decrease the power consumption) of the memory, among other benefits. Further, the estimated error rate can be used for calibrating sensing voltages (e.g., read voltage thresholds) used to sense the state of the memory.

Further, because the error estimation process described herein uses LDPC code parities to estimate the error rate, the process does not have its own dedicated parity. As such, the error estimation process described herein does not have any additional parity overhead.

The embodiment illustrated in FIG. 2 can include additional circuitry, logic, and/or components not illustrated so as not to obscure embodiments of the present disclosure. For example, memory device 230 can include address circuitry to latch address signals provided over I/O connectors through I/O circuitry. Address signals can be received and decoded by a row decoder and a column decoder, to access memory array 200.

Figure 3:
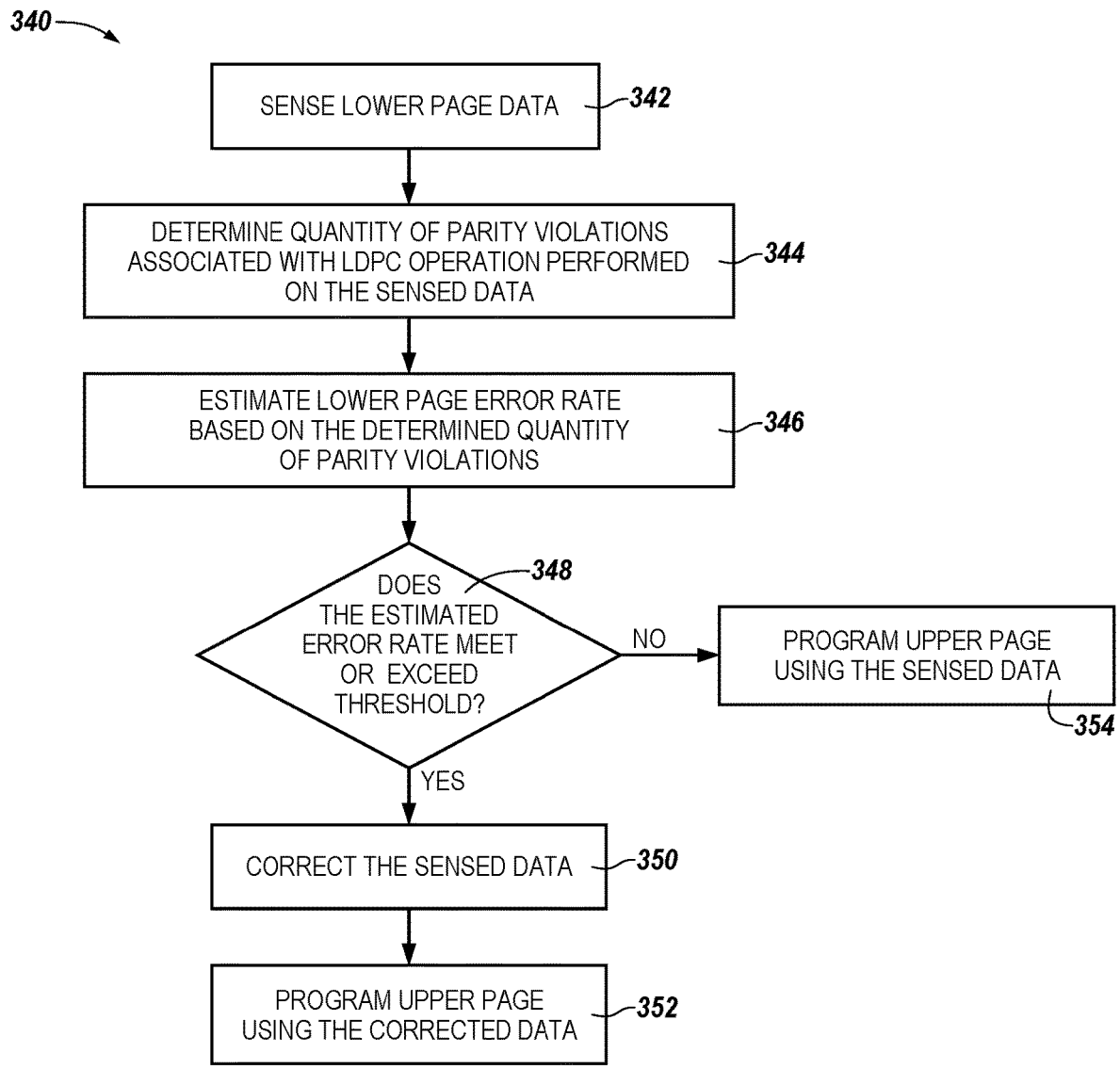
FIG. 3 illustrates a method for operating memory in accordance with a number of embodiments of the present disclosure.

FIG. 3 illustrates a method 340 for operating memory (e.g., memory 234 previously described in connection with FIG. 2) in accordance with a number of embodiments of the present disclosure. Elements of method 340 can be performed by, for example, error rate estimation circuitry 236 previously described in connection with FIG. 2.

Method 340 can be used, for example, to mitigate lower page misplacement (e.g., write-in errors) that may occur while programming an upper page of data in multilevel memory cells. Mitigating lower page misplacement can, for example, reduce or eliminate a type of bit errors that have high reliability. These errors are similar to write-in errors (e.g., programming the wrong data to the flash memory), and can deteriorate soft ECC performance.

At block 342, method 340 includes sensing a lower page of data stored in a group of memory cells of a memory array (e.g., array 200 previously described in connection with FIG. 2). The data may be sensed, for example, as part of a sense operation initiated by a controller of the memory (e.g., controller 232 previously described in connection with FIG. 2).

At block 344, method 340 includes determining a quantity of parity violations associated with an LDPC operation performed on the sensed data. The LDPC operation can be performed, and the quantity of parity violations determined, by error rate estimation circuitry 236, as previously described in connection with FIG. 2.

At block 346, method 340 includes estimating an error rate associated with the lower page of data based on the determined quantity of parity violations. The error rate can be estimated by error rate estimation circuitry 236, as previously described in connection with FIG. 2.

At block 348, method 340 includes determining whether the estimated error rate meets or exceeds a threshold. This determination can be made, for example, by error rate estimation circuitry 236, and can include comparing the estimated error rate to the threshold. The threshold may be based on (e.g., be a function of), for example, the error correction capability of the controller (e.g., the error correction component on the controller) of the memory (e.g., the quantity of erroneous data the controller is capable of correcting). For instance, the threshold can be directly proportional to (e.g., increase with) the error correction capability of the controller (e.g., the error correction component).

In the example shown in FIG. 3, if it is determined that the estimated error rate meets or exceeds the threshold, then the sensed data is corrected at block 350, and an upper page of data (e.g., the upper page corresponding to the lower page) can be programmed to the group of memory cells of the array using the corrected data at block 352. That is, the estimated error rate meeting or exceeding the threshold can be an indication that lower page misplacement has occurred, and as such the lower page data should be corrected before the upper page is programmed. Correcting the sensed data can include, for example, sending the sensed lower page data to the controller (e.g., the error correction component on the controller) of the memory, correcting the sensed data using the controller (e.g., the error correction component), and sending back the corrected data to the flash die, which can then be programmed to the flash along with the upper page data. For instance, the error correction component of the controller can perform an error correction operation on the sensed data to correct the sensed data.

If it is determined that the estimated error rate does not meet or exceed the threshold, then the upper page of data can be programmed using the sensed data at block 354. That is, the estimated error rate not meeting or exceeding the threshold can be an indication that the errors in the lower page are not high enough to pose a problem for soft ECC decoding, and therefore there is no need to correct the lower page errors before upper page programming.

Figure 4:
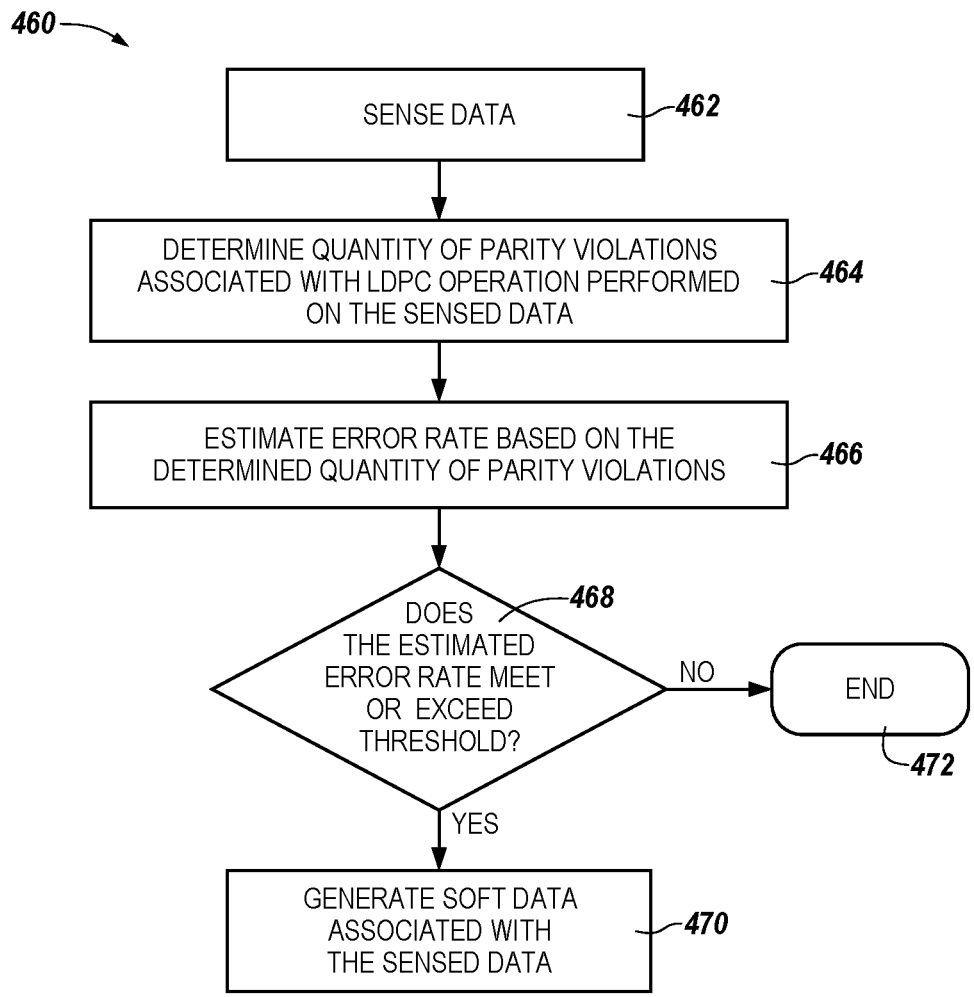
FIG. 4 illustrates a method for operating memory in accordance with a number of embodiments of the present disclosure.

FIG. 4 illustrates a method 460 for operating memory (e.g., memory 234 previously described in connection with FIG. 2) in accordance with a number of embodiments of the present disclosure. Elements of method 460 can be performed by, for example, error rate estimation circuitry 236 previously described in connection with FIG. 2.

Method 460 can be used, for example, to determine whether soft data associated with the memory should be automatically generated. For example, method 460 can be used to automatically generate (e.g., prepare) the soft data, without (e.g., before) receiving a request to do so (e.g., from a controller of the memory). If the estimated error rate is believed to be too high to be corrected by an ECC scheme using only hard information, soft data can be automatically generated and sent to the controller instead of, or in addition to, the hard information. If this is not done, then in the case of a hard ECC failure, the controller may request soft data from the flash which is generated after the request is received. Automatic soft data generation can reduce this latency significantly.

Soft data, as used herein, can include data associated with the hard data of a memory cell. For instance, hard data can refer to the binary data value stored in one or more memory cells and provided to a host responsive to a sense (e.g., read) operation, and soft data can refer to data associated with the sensed data state (e.g., data associated with the sensed hard data). The soft data can, for example, indicate the quality and/or confidence of the hard data (e.g., information regarding the probability of the cell storing the read hard data or of the cell storing different data). For instance, the soft data (e.g., soft data values) associated with the sensed data state of the cell can indicate the location of the threshold voltage (Vt) associated with the cell within the Vt distribution associated with the data state of the cell. Further, the soft data associated with the sensed data state of the cell can indicate the probability of whether the Vt associated with the cell corresponds to the data state of the cell. Soft data can be generated by making multiple reads of the memory, and can aid the ECC scheme in correcting a higher number of bit errors compared to hard data.

At block 462, method 460 includes sensing data (e.g., hard data) stored in the memory. The sensed data may be, for example, a page of data stored in a group of memory cells of a memory array (e.g., array 200 previously described in connection with FIG. 2) of the memory. The data may be sensed, for example, as part of a sense operation initiated by a controller of the memory (e.g., controller 232 previously described in connection with FIG. 2).

At block 464, method 460 includes determining a quantity of parity violations associated with an LDPC operation performed on the sensed hard data. The LDPC operation can be performed, and the quantity of parity violations determined, by error rate estimation circuitry 236, as previously described in connection with FIG. 2.

At block 466, method 460 includes estimating an error rate associated with the memory (e.g., associated with the page) based on the determined quantity of parity violations. The error rate can be estimated by error rate estimation circuitry 236, as previously described in connection with FIG. 2.

At block 468, method 460 includes determining whether the estimated error rate meets or exceeds a threshold. This determination can be made, for example, by error rate estimation circuitry 236, and can include comparing the estimated error rate to the threshold. The threshold may be based on (e.g., be a function of), for example, the error correction capability of the controller (e.g., the error correction component on the controller) of the memory, as previously described in connection with FIG. 3. However, the threshold may be different than the threshold described in connection with FIG. 3.

In the example shown in FIG. 4, if it is determined that the estimated error rate meets or exceeds the threshold, then soft data associated with the sensed (e.g., hard) data is generated (e.g., prepared) at block 470 by making multiple reads at the flash with the belief that that bit error rate in the sensed data is too high for the hard ECC, and therefore soft data will be needed to correct the bit errors. That is, the soft data can automatically be generated (e.g., without receiving a request to do so from the controller of the memory) upon a determination that the estimated error rate meets or exceeds the threshold.

If it is determined that the estimated error rate does not meet or exceed the threshold, then method 460 ends at block 472. That is, if it is determined that the estimated error rate does not meet or exceed the threshold, soft data associated with the sensed data may not be automatically generated with the belief that the bit error rate in the sensed data is within the correction capability of the hard ECC. Rather, if it is determined that the estimated error rate does not meet or exceed the threshold, soft data associated with the sensed data may be determined only upon receipt of a request (e.g., from the controller of the memory) for the soft data.

Figure 5:
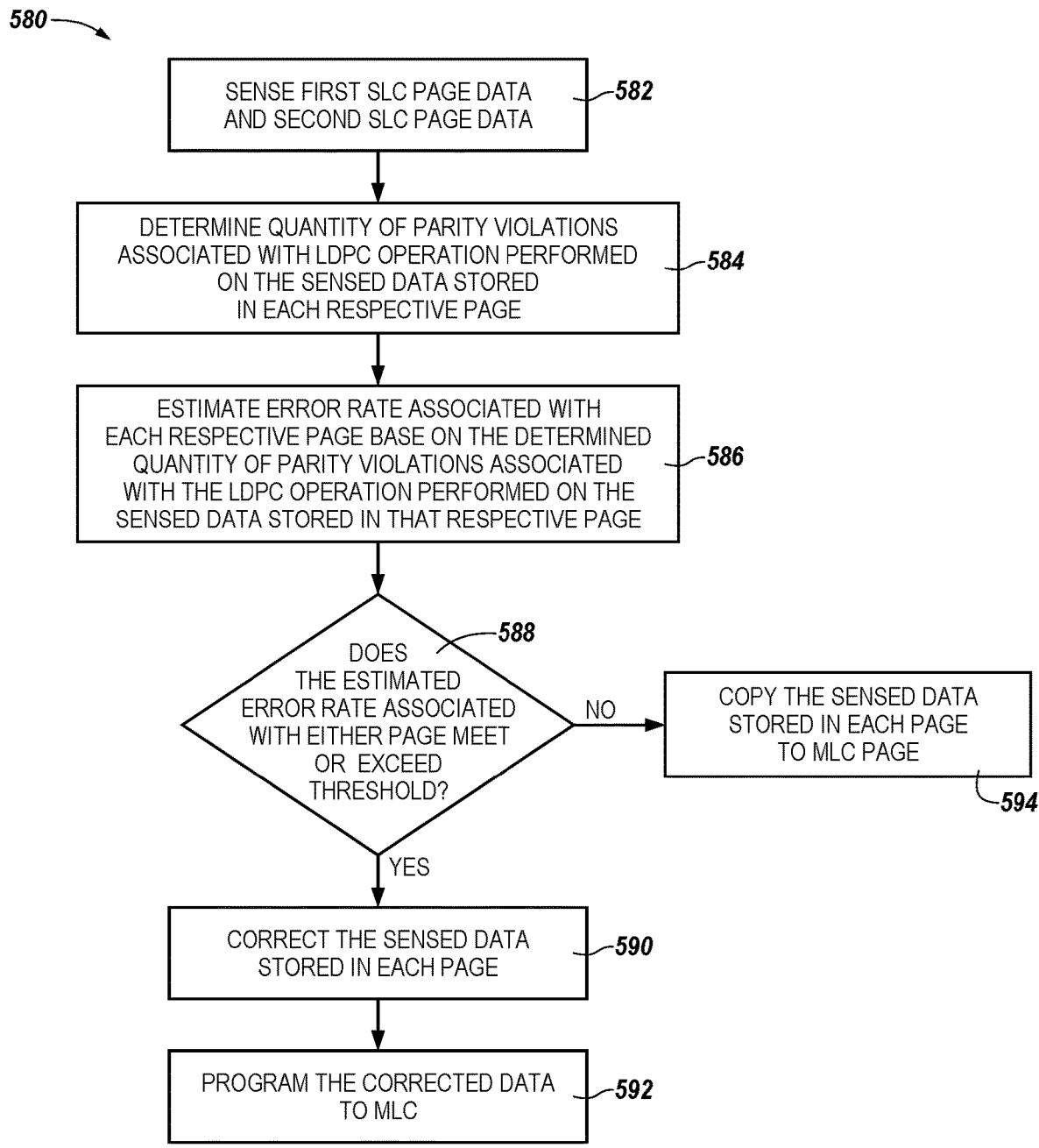
FIG. 5 illustrates a method for operating memory in accordance with a number of embodiments of the present disclosure.

FIG. 5 illustrates a method 580 for operating memory (e.g., memory 234 previously described in connection with FIG. 2) in accordance with a number of embodiments of the present disclosure. Elements of method 580 can be performed by, for example, error rate estimation circuitry 236 previously described in connection with FIG. 2.

Method 580 can be used, for example, to compact data stored in multiple SLC pages of the memory to MLC cells of the memory. The data compaction process may include SLC caching (e.g., first writing the data to the SLC pages, and then moving the data to MLC cells). As an example in which the MLC cell is a TLC cell, the data compaction process may include reading three SLC pages, and then compacting the read data to be stored in three bits per cell in the TLC cell. For instance, method 580 can be used to make such data compaction quicker and/or more efficient by only correcting the data to be compacted if the error rate of the sensed data is determined to pose a problem for the ECC scheme after compaction (e.g., by avoiding unnecessary correction of the data). The process of compacting multiple SLC pages to MLC (e.g., TLC) cells without sending the sensed SLC pages to the controller for error correction can be referred to as a copyback mode.

At block 582, method 580 includes sensing a first page of data and a second page of data stored in single level cells (SLCs) of a group of memory cells of a memory array (e.g., array 200 previously described in connection with FIG. 2). The data may be sensed, for example, as part of a sense operation initiated by a controller of the memory (e.g., controller 232 previously described in connection with FIG. 2).

At block 584, method 580 includes determining a quantity of parity violations associated with an LDPC operation performed on the sensed data of (e.g., stored in) each respective SLC page. The LDPC operations can be performed, and the quantities of parity violations determined, by error rate estimation circuitry 236, as previously described in connection with FIG. 2.

At block 586, method 580 includes estimating an error rate associated with each respective SLC page of data based on the determined quantity of parity violations associated with the LDPC operation performed on the sensed data stored in that respective SLC page. The error rate can be estimated by error rate estimation circuitry 236, as previously described in connection with FIG. 2.

At block 588, method 580 includes determining whether the estimated error rate associated with either SLC page meets or exceeds a threshold. This determination can be made, for example, by error rate estimation circuitry 236, and can include comparing the estimated error rate to the threshold. The threshold may be based on (e.g., be a function of), for example, the error correction capability of the controller (e.g., the error correction component on the controller) of the memory, as previously described in connection with FIG. 3. However, the threshold may be different than the threshold described in connection with FIG. 3.

In the example shown in FIG. 5, if it is determined that the estimated error rate associated with either SLC page meets or exceeds the threshold, then the sensed data stored in each SLC page is corrected at block 590, and the corrected data is programmed to multilevel cells (MLCs) in the group of memory cells at block 592 to complete the data compaction. That is, either estimated error rate meeting or exceeding the threshold can be an indication that the errors in the SLC page may pose a problem for the ECC after compaction. Correcting the sensed SLC page data can include, for example, sending the sensed data to the controller (e.g., the error correction component on the controller) of the memory, and correcting the sensed data using the controller (e.g., the error correction component), as previously described in connection with FIG. 3.

If it is determined that the estimated error rate associated with neither the first SLC page nor the second SLC page meets or exceeds the threshold, then the sensed data stored in each SLC page can be copied to the third page of data (e.g., the MLC page) of the memory at block 594 to complete the data compaction. That is, neither estimated error rate meeting or exceeding the threshold can be an indication that the bit errors in the SLC pages will not pose a problem for the ECC scheme in the sense that the errors in the compacted data will be within the correction power of the underlying ECC scheme. Rather, the SLC page data may need to be corrected only if either estimated error rate meets or exceeds the threshold.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory; and
   circuitry configured to:
   sense data stored in the memory;
   determine a quantity of parity violations associated with a low-density parity-check (LDPC) operation performed on the sensed data;
   estimate an error rate associated with the memory based on the determined quantity of parity violations;
   determine whether the estimated error rate meets or exceeds a threshold; and
   generate soft data associated with the sensed data upon determining the estimated error rate meets or exceeds the threshold.

2. The apparatus of claim 1, wherein the circuitry is configured to automatically generate the soft data associated with the sensed data upon determining the estimated error rate meets or exceeds the threshold.

3. The apparatus of claim 1, wherein the circuitry is configured to, upon determining the estimated error rate does not meet or exceed the threshold, generate the soft data associated with the sensed data only upon receiving a request for the soft data.

4. The apparatus of claim 1, wherein the soft data associated with the sensed data indicates a location of a threshold voltage associated with the memory within a threshold voltage distribution associated with a data state of the memory.

5. The apparatus of claim 1, wherein the soft data associated with the sensed data indicates a probability of whether a threshold voltage associated with the memory corresponds to a data state of the memory.

6. The apparatus of claim 1, wherein the circuitry is configured to determine the quantity of parity violations associated with the LDPC operation by summing a quantity parity violations that occur during XOR operations performed during the LDPC operation.

7. A method for operating memory, comprising:
   sensing a first page of data and a second page of data stored in a group of memory cells;
   determining a quantity of parity violations associated with a low-density parity-check (LDPC) operation performed on the sensed data of each respective page;
   estimating an error rate associated with each respective page of data based on the determined quantity of parity violations associated with the LDPC operation performed on the sensed data of that respective page;
   determining whether the estimated error rate associated with either page meets or exceeds a threshold; and
   upon determining the estimated error rate associated with either page meets or exceeds the threshold:
   correcting the sensed data of each page; and
   programming the corrected data to a group of multilevel memory cells.

8. The method of claim 7, wherein the method includes copying the sensed first page of data and the sensed second page of data to a group of multilevel memory cells upon determining the estimated error rate associated with neither the first page nor the second page meets or exceeds the threshold.

9. The method of claim 7, wherein the method includes correcting the sensed data of the first page or the second page only upon determining the estimated error rate associated with either the first page or the second page meets or exceeds the threshold.

10. The method of claim 7, wherein:
    the first page of data and the second page of data are stored in single level memory cells; and
    the first page of data and the second page of data are copied to multilevel memory cells.

11. The method of claim 10, wherein the multilevel memory cells are triple level memory cells.

12. The method of claim 7, wherein:
    the group of memory cells are included on a memory die; and
    the method includes estimating the error rate associated with each respective page of data using circuitry included on the memory die.

13. An apparatus, comprising:
    a memory; and
    circuitry configured to:
    sense data stored in the memory;
    determine a quantity of parity violations associated with a low-density parity-check (LDPC) operation performed on the sensed data;
    estimate an error rate associated with the memory based on the determined quantity of parity violations;
    determine whether the estimated error rate meets or exceeds a threshold; and
    upon determining the estimated error rate meets or exceeds the threshold:
    correct the sensed data; and
    program the corrected data to a group of memory cells.

14. The apparatus of claim 13, wherein the sensed data includes data stored in two different pages of the memory.

15. The apparatus of claim 13, wherein the group of memory cells includes multilevel memory cells.

16. The apparatus of claim 13, wherein the circuitry is configured to perform the LDPC operation on the sensed data by:
   interleaving the sensed data into a number of data segments; and
   performing an XOR operation on each of the data segments.

17. The apparatus of claim 13, wherein the circuitry is configured to estimate an error rate on a memory die associated with the memory based on the determined quantity of parity violations.

18. The apparatus of claim 13, wherein:
   the apparatus includes a controller coupled to the memory; and
   the circuitry is configured to, upon determining the estimated error rate meets or exceeds the threshold:
      generate soft data to send to the controller; and
      correct the sensed data using the soft data.

19. The apparatus of claim 18, wherein the circuitry is configured to correct the sensed data using the soft data to reduce errors in the sensed data prior to programming the corrected data to the group of memory cells.

20. The apparatus of claim 18, wherein the circuitry is configured to generate the soft data to send to the controller prior to the controller requesting the soft data to reduce latency in the controller receiving the soft data.

* * * * *